(12) United States Patent
Hong et al.

(10) Patent No.: US 6,451,666 B2
(45) Date of Patent: Sep. 17, 2002

(54) METHOD FOR FORMING A LOWER ELECTRODE BY USING AN ELECTROPLATING METHOD

(75) Inventors: Kwon Hong; Heung-Sik Kwak; Chung-Tae Kim; Hyung-Bok Choi, all of Kyoungki-do (KR)

(73) Assignee: Hyundai Electronics Industries Co., LTD, Ichon-shi (KR)

( * ) Notice: Subject to any disclaimer, the term of this patent is extended or adjusted under 35 U.S.C. 154(b) by 0 days.

(21) Appl. No.: 09/735,528

(22) Filed: Dec. 14, 2000

(30) Foreign Application Priority Data

Dec. 27, 1999 (KR) .............................. 99-62959
Jul. 29, 2000 (KR) .............................. 00-43958

(51) Int. Cl.[7] ......................... H01L 21/8242; C25D 5/02
(52) U.S. Cl. ..................... 438/397; 438/253; 438/636; 438/618
(58) Field of Search ................................ 438/238, 239, 438/240, 253, 636, 650, 686, 397, 396, 597, 618

(56) References Cited

U.S. PATENT DOCUMENTS 6,319,765 B1 * 11/2001 Cho et al. .................. 438/240
2001/0052466 A1 * 12/2001 Horii .......................... 205/122

* cited by examiner

Primary Examiner—Richard Elms
Assistant Examiner—Beth E. Owens
(74) Attorney, Agent, or Firm—Finnegan, Henderson, Farabow, Garrett & Dunner, L.L.P.

(57) ABSTRACT

A method for manufacturing a semiconductor device can form a thick lower electrode made of Pt. The method begins with the preparation of an active matrix provided with at least one transistor, a plurality of conductive plugs electrically connected to the transistors and an insulating layer formed around the conductive plugs. Thereafter, a seed layer is formed on top of the active matrix and a dummy oxide layer is formed on top of the seed layer. Then, the dummy oxide layer is patterned into a predetermined configuration, thereby exposing portions of the seed layer which are located on top of the conductive plugs. The exposed portions are filled with a conductive material to a predetermined thickness. The dummy oxide layer and portions of the seed layer which are not covered with the conductive material are removed, thereby obtaining lower electrodes. A capacitor dielectric layer is on the lower electrodes. Finally, an upper electrode layer is formed on the capacitor dielectric layer.

18 Claims, 4 Drawing Sheets

US 6,451,666 B2

METHOD FOR FORMING A LOWER ELECTRODE BY USING AN ELECTROPLATING METHOD

FIELD OF THE INVENTION

The present invention relates to a semicondutor device; and, more particularly, to a method for forming a lower electrode for use in a semiconductor device by using an electroplating method.

DESCRIPTION OF THE PRIOR ART

As is well known, a dynamic random access memory (DRAM) with at least one memory cell comprised of a transistor and a capacitor has a higher degree of integration mainly by down-sizing through micronization. However, there is still a demand for down-sizing the area of the memory cell.

To meet the demand, there have been proposed several structures for the capacitor, such as a trench type or a stack type capacitor, which are arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

Since capacitance is a function of dielectric area and the dielectric constant of the dielectric material, there have been introduced a high K dielectric, e.g., barium strontium titanate (BST) or the like, as a capacitor thin film in place of conventional silicon oxide film or silicon nitride film to increase capacitance in a given area. However, the use of high dielectric constant materials presents a problem when using a conventional material like ruthenium (Ru) as an electrode. The Ru electrode creates leakage current in the capacitance device.

Therefore, platinum (Pr) is suitable for use as electrodes in this situation. However, Pt is very difficult to be patterned by a conventional process such as a reactive ion etching (RIE), vertically, which, in turn, gives sloped sidewalls to a patterned thick Pt layer.

Thus, there remains a need for a method of forming an electrode compatible with a high K capacitor dielectric without representing the above-described problems.

SUMMARY OF THE INVENTION

It is, therefore, an object of the present invention to provide a semiconductor device incorporating therein lower electrodes which are formed by using an electroplating method.

In accordance with one aspect of the present invention, there is provided a method for manufacturing a semiconductor device for use in a memory cell, the method comprising the steps of: a) preparing an active matrix provided with at least one transistor, a plurality of conductive plugs electrically connected to the transistors and an insulating layer formed around the conductive plugs; b) forming a seed layer on top of the active matrix; c) forming a dummy oxide layer on top of the seed layer; d) patterning the dummy oxide layer into a predetermined configuration, thereby exposing portions of the seed layer which are located on top of the conductive plugs; e) filling the exposed portions with a first conductive material to a predetermined thickness; f) removing the dummy oxide layer; g) removing portions of the seed layer which are not covered with the conductive material, thereby obtaining lower electrodes; h) forming a capacitor dielectric layer on the lower electrodes; and i) forming a second conductive layer on the capacitor dielectric layer.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 1A to 1H cross sectional views setting forth a method for manufacturing a semiconductor device incorporating therein a lower electrode which is formed by using an electroplating method in accordance with preferred embodiments of the present invention.

FIGS. 1A to 1H are schematic cross sectional views setting forth the method for the manufacture of a capacitor structure 150 for use in a semiconductor memory device in accordance with the present invention.

Figure 1A:
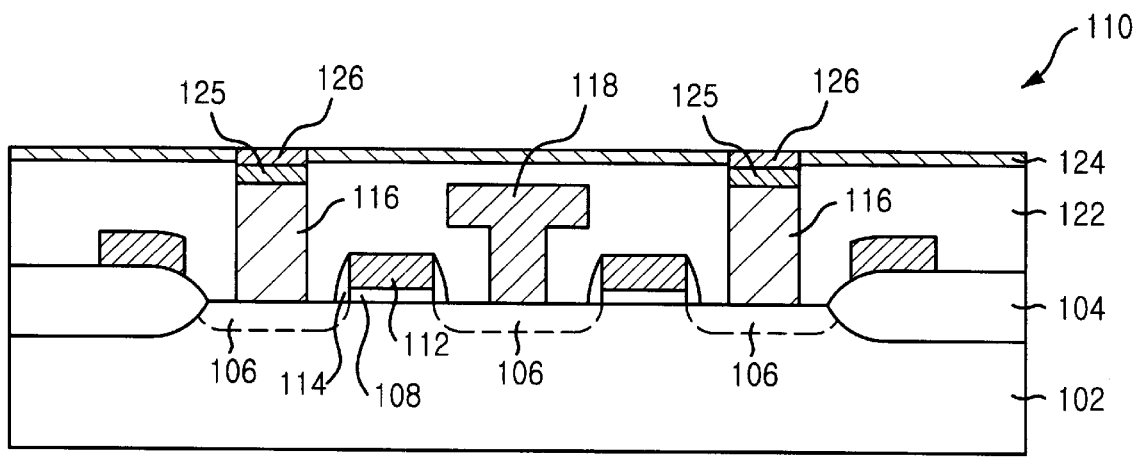
FIGS. 1A to 1H are schematic cross sectional views setting forth a method for the manufacture of the semiconductor memory device in accordance with the present invention.

The process for manufacturing the semiconductor device begins with the preparation of an active matrix 110 including a silicon substrate 102, an isolation region 104, diffusion regions 106, gate oxides 108, gate lines 112, a sidewall 114, a bit line 118, poly plugs 116, barrier metals 126, anti-reflection coating (ARC) films 124 and an insulating layer 132, as shown in FIG. 1A. The bit line 118 is electrically connected to one of the diffusion regions 106 to apply an electric potential. Each of the poly plugs 116 is electrically connected to the other diffusion regions 106, respectively, although the bit line 118 actually extends in right and left direction bypassing the poly plugs 116, the drawing does not show these parts of the bit line 118. The capacitor structures 150 (FIG. 1H) can be connected to a plate line (not shown) to apply thereto a common constant potential. The insulating layer 122 is made of a material, e.g. boron-phosphor-silicate glass (BPSG).

In the preferred embodiment, the barrier metals 126 are formed on top of the poly plugs 116 and the ARC films 124 are formed on portions of the active matrix 110 which are not covered with the barrier metals 126. It is preferable that the barrier metals 126 are made of a material selected from a group consisting of TiN, TiSiN, TiAlN, TaSiN, TaAlN or the like. And also, the ARC films 124 are formed with a material having a high etch selectivity with respect to a dummy oxide layer to be formed thereon in a thickness ranging from approximately 300 Å to approximately 1,000 Å. In order to reduce contact resistance between the ploy plugs 116 and the barrier metals 126, TiSix films 125 can be formed between the poly plugs 116 and the barrier metals 126 in a thickness ranging from approximately 100 Å to approximately 300 Å. After the formation of the barrier metals 126, a chemical mechanical polishing (CMP) can be carried out to make their top surface flattened.

Figure 1B:
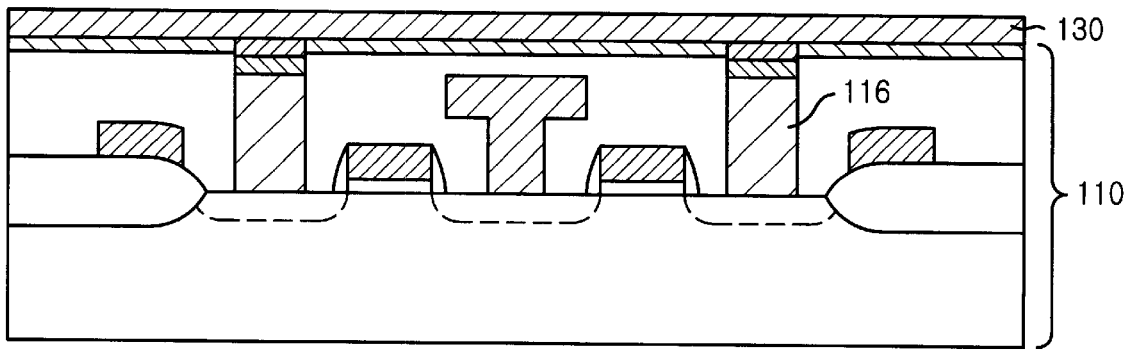

In an ensuing step, a seed layer 130 is formed by using a chemical vapor deposition (CVD) method on top of the ARC films 124 and the barrier metals 126, as shown in FIG. 1B. The seed layer 130 can be made of a material selected from a group consisting of Pt, Ru, Ir, Os, W, Mo, Co, Ni, Au, Ag or the like. It is preferable that if Pt is selected as the seed layer 130, the seed layer 130 has a thickness ranging from approximately 50 Å to approximately 1,300 Å.

Figure 1C:
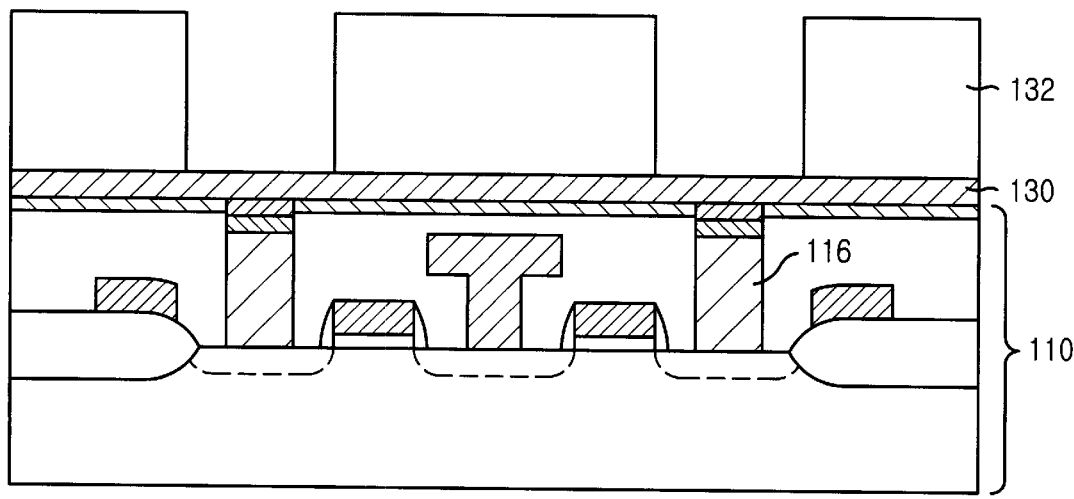

In a following step, a dummy oxide later is formed on top of the seed layer 130 by using a method such as CVD. The dummy oxide layer can be made of phosphor-silicate glass (PSG) or undoped silicon glass (USG). Preferably, the dummy oxide has a thickness ranging from approximately 5,000 Å to approximately 20,000 Å. Thereafter, the dummy oxide layer is patterned into a predetermined configuration in such a way that portion of the seed layer 130 located on top of the poly plugs 116 are exposed, thereby forming a patterned dummy oxide 132, as shown in FIG. 1C.

Optionally, the active matrix 110 is dipped into a solution selected from a 90% $H_2SO_4$ solution, $H_2SO_4/H_2O_2$ solution, $HF/H_2O$ solution, $HF/HN_4F$ solution during 2-3600 seconds in order to remove particles or foreign material remaining on the exposed seed layer 130.

Figure 1D:
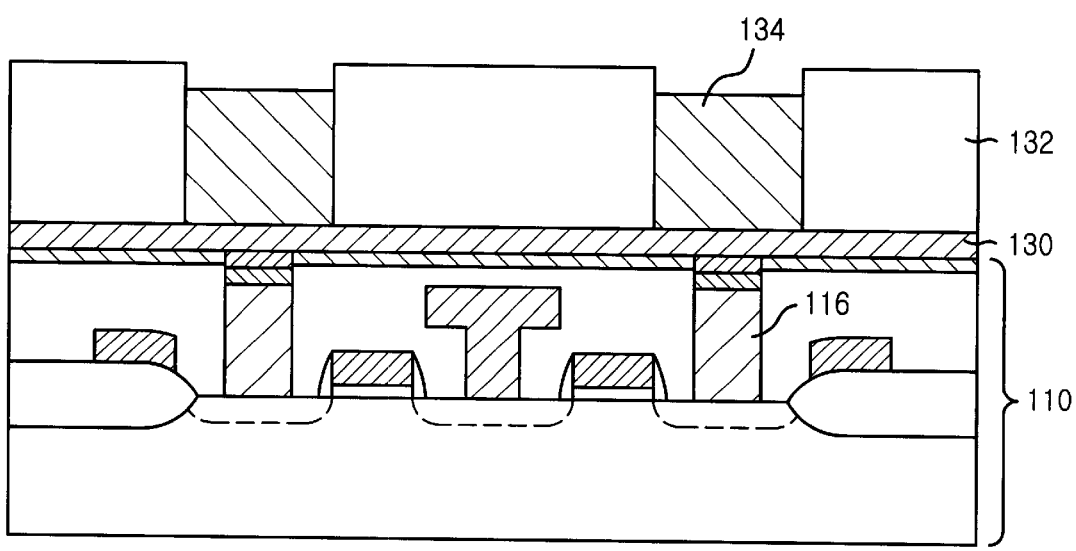

In the next step, the exposed portions of the seed layer 130 are electroplated with a material from a group consisting of Pt, Ir, Os, W, Mo, Co, Ni, Au, Ag or the like, as shown in FIG. 1D. It is preferable that an electroplating material 134 corresponds to that of the seed layer 130. If the electroplating material is Pt, a thickness of the electroplating material 134 has a thickness ranging from approximately 3,000 Å to approximately 10,000 Å. In this case, the electroplating process is carried out with a current density ranging from approximately 0.1 $mA/cm^2$ to approximately 10 $mA/cm^2$. Alternatively, it is possible to deposit a conductive material on top of the exposed positions of the seed layer 130 by using CVD.

Figure 1E:
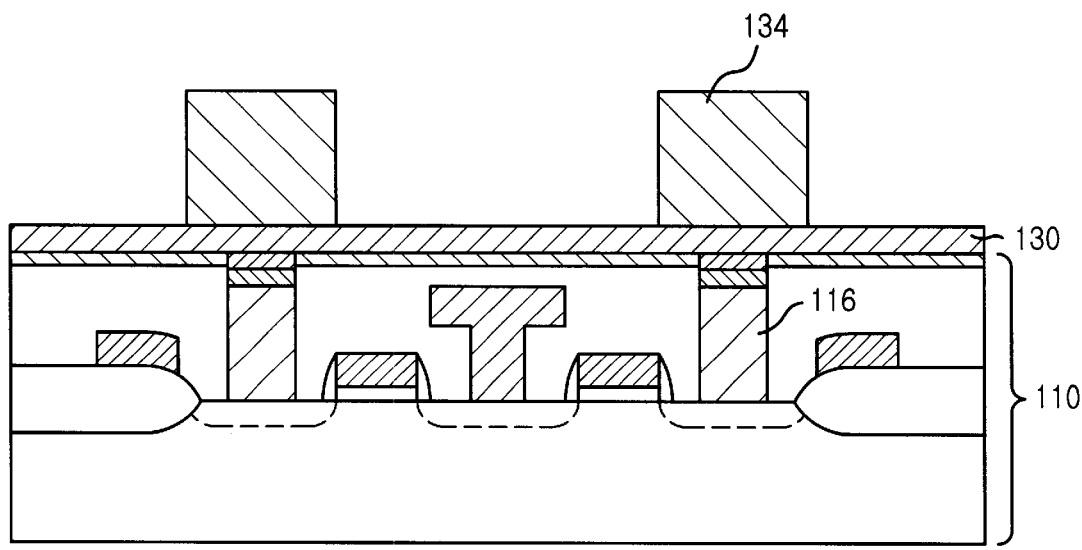

Thereafter, the patterned dummy oxide 132 is removed by using a method such as a wet etching, as shown in FIG. 1E.

Figure 1F:
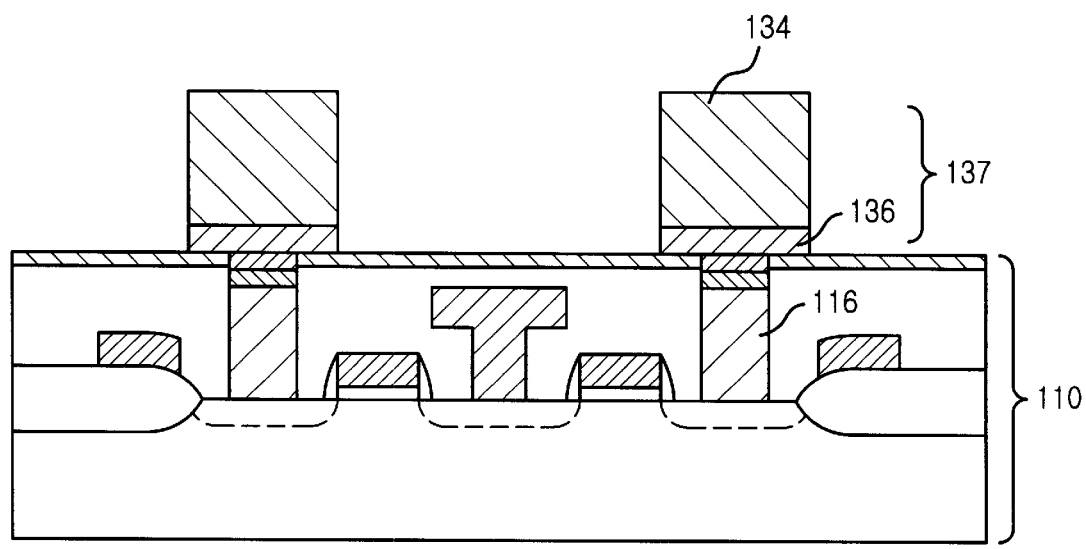

And then, the portions of the seed layer 130 which are not covered by the electroplating material 134 are etched-back by using a method such as a dry etching, thereby forming lower electrodes 137, wherein each of the lower electrodes includes a electroplating material 134 and an etched seed layer 136, as shown in FIG. 1F.

Figure 1G:
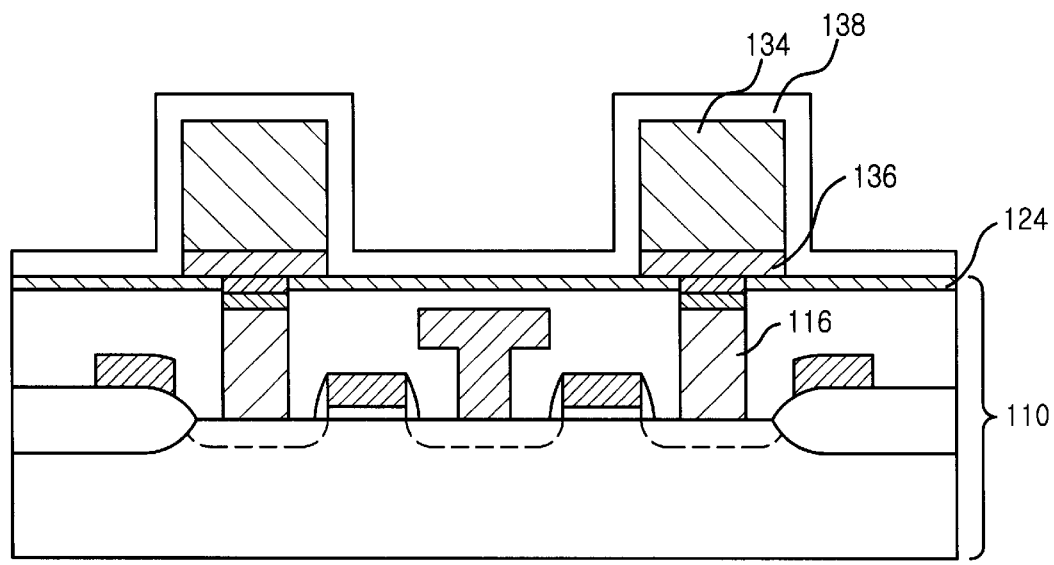

In a subsequent step, a capacitor dielectric layer 138, e.g., made of barium strontium titanate (BST), are formed on the lower electrodes 137 and the ARC film 124 by using a CVD method at a temperature ranging from approximately 400° C. to approximately 600° C. in a thickness ranging from approximately 150 Å to approximately 500 Å, as shown in FIG. 1G. It is possible that the capacitor dielectric layer 138 are crystallized by using a rapid thermal process (RTP) at a temperature ranging from approximately 500° C. to approximately 700° C. in the presence of $N_2$ for 30–180 seconds.

Figure 1H:
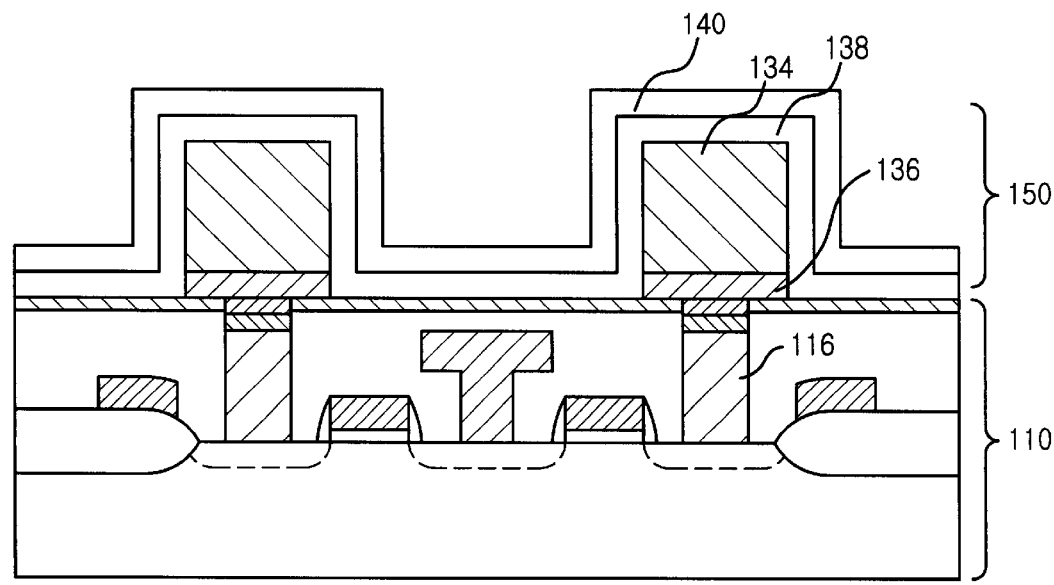

Finally, an upper electrode layer 140 is formed on the capacitor dielectric layer 138 by using a method such as a CVD, thereby forming capacitor structures 150, as shown in FIG. 1H.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device, the method comprising the steps of:
   a) preparing an active matrix provided with at least one transistor, a plurality of conductive plugs electrically connected to the transistors and an insulating layer formed around the conductive plugs;
   b) forming barrier metals on top of the conductive plugs and forming anti-reflection coating (ARC) films on portions of the active matrix which are not covered with diffusion barriers;
   c) forming a seed layer on top of the active matrix;
   d) forming a dummy oxide layer on the seed layer;
   e) patterning the dummy oxide layer into a predetermined configuration, thereby exposing portions of the seed layer which are located on top of the conductive plugs;
   f) filling the exposed portions with a conductive material to a predetermined thickness;
   g) removing the dummy oxide layer;
   h) removing portions of the seed layer which are not covered with the conductive material, thereby obtaining lower electrodes;
   i) forming a capacitor dielectric on the lower electrodes; and
   j) forming an upper electrode layer on the capacitor dielectric layer.

2. The method of claim 1, wherein the capacitor dielectric layer includes barium strontium titanate (BST).

3. The method of claim 1, wherein the barrier metals include a material selected form a group consisting of TiN, TiSiN, TiAlN, TaSiN, and TaAlN.

4. The method of claim 1, before the formation of the barrier metals, further comprising a step of forming a layer of $TiSi_x$ in a thickness ranging from approximately 100 Å to approximately 300 Å to reduce contact resistance between the conductive plugs and the barrier metals.

5. The method of claim 1, wherein the ARC films include a material having a high etch selectivity with respect to the dummy oxide layer and formed in a thickness ranging from approximately 300 Å to approximately 1,000 Å.

6. The method of claim 5, wherein the ARC films include SiON.

7. The method of claim 1, wherein the seed layer includes a material selected form a group consisting of Pt, Ru, Ir, Os, W, Mo Co, Ni, Au, and Ag.

8. The method of claim 7, wherein the step f) is carried out by electroplating the exposed portions with a conductive material corresponding to that of the seed layer.

9. The method of claim 8, wherein if the seed layer is made of Pt, the seed layer has a thickness ranging from approximately 50 Å to approximately 1,000 Å.

10. The method of claim 8, wherein the electroplating process is carried cut with a current density ranging from approximately 0.1 $mA/cm^2$ to approximately 10 $mA/cm^2$.

11. The method of claim 1, wherein the dummy oxide layer includes PSG and has a thickness ranging from approximately 5,000 Å to approximately 20,000 Å.

12. The method of claim 1, wherein the dummy oxide layer includes USG and has a thickness ranging from approximately 5,000 Å to approximately 10,000 Å.

13. The method of claim 12, wherein the conductive material is Pt and has a thickness that ranges from approximately 3,000 Å to approximately 10,000 Å.

14. The method of claim 1, wherein the step h) is carried out by using a dry etch back.

15. The method of claim 1, wherein the step f) is carried out by using CVD.

16. The method of claim 1, between the steps e) and f), further comprising a step of dipping the exposed portions of seed layer into a solution selected from a group consisting of a 90% $H_2SO_4$ solution, $H_2SO_4/H_2O_2$ solution, $HF/H_2O$ solution, $HF/HN_4F$ solution for a duration of 2–3600 seconds to remove particles or foreign material remaining thereon.

17. The method of claim 2, wherein the capacitor dielectric layer is formed by using chemical vapor deposition (CVD) at a temperature ranging from approximately 400° C. to approximately 600° C. in a thickness ranging from approximately 150 Å to approximately 500 Å.

18. The method of claim 2, further comprising a step of crystallizing the capacitor dielectric layer by using a rapid thermal process (RTP) at a temperature ranging from approximately 500° C. in the presence of $N_2$ for 30–180 seconds.

* * * * *

UNITED STATES PATENT AND TRADEMARK OFFICE
CERTIFICATE OF CORRECTION

PATENT NO. : 6,451,666 B2
DATED : September 17, 2002
INVENTOR(S) : Kwon Hong and Chung-Tae Kim It is certified that error appears in the above-identified patent and that said Letters Patent is hereby corrected as shown below:

<u>Column 4,</u>
Lines 41 and 56, "form" should read -- from --.
Line 57, after "Mo" insert a comma.
Line 66, "cut" should read -- out --.

Signed and Sealed this

First Day of July, 2003

JAMES E. ROGAN
*Director of the United States Patent and Trademark Office*